(12) United States Patent
Yamaguchi et al.

(10) Patent No.: US 9,420,706 B2
(45) Date of Patent: Aug. 16, 2016

(54) MULTILAYER WIRING BOARD

(71) Applicant: Tatsuta Electric Wire & Cable Co., Ltd., Higashiosaka-shi, Osaka (JP)

(72) Inventors: Norihiro Yamaguchi, Higashiosaka (JP); Hiroaki Umeda, Higashiosaka (JP); Ken Yukawa, Higashiosaka (JP)

(73) Assignee: Tatsuta Electric Wire & Cable Co., Ltd., Osaka (JP)

( * ) Notice: Subject to any disclaimer, the term of this patent is extended or adjusted under 35 U.S.C. 154(b) by 0 days.

(21) Appl. No.: 14/164,900

(22) Filed: Jan. 27, 2014

(65) Prior Publication Data

US 2014/0138126 A1 May 22, 2014

Related U.S. Application Data

(62) Division of application No. 13/256,114, filed as application No. PCT/JP2010/001656 on Mar. 9, 2010, now Pat. No. 8,756,805.

(30) Foreign Application Priority Data

Mar. 12, 2009 (JP) .................................. 2009-059375
Jul. 22, 2009 (JP) .................................. 2009-171229

(51) Int. Cl.
*H05K 1/09* (2006.01)
*H05K 3/46* (2006.01)
(Continued)

(52) U.S. Cl.
CPC .. *H05K 3/46* (2013.01); *H01B 1/22* (2013.01); *H05K 1/0298* (2013.01);
(Continued)

(58) Field of Classification Search
CPC ..... H05K 3/4626; H05K 1/0298; H05K 3/46; H05K 1/188; H05K 7/06; H01L 2924/1517
USPC .................. 29/852, 825, 829, 837, 846, 850; 174/251, 257, 259
See application file for complete search history.

(56) References Cited

U.S. PATENT DOCUMENTS 4,544,801 A 10/1985 Rudik et al.
5,584,121 A 12/1996 Arike et al.
(Continued)

FOREIGN PATENT DOCUMENTS

JP 7-176846 7/1995
JP 2002-232147 8/2002
(Continued)

*Primary Examiner* — Thiem Phan
(74) *Attorney, Agent, or Firm* — Norris McLaughlin & Marcus, P.A.

(57) ABSTRACT

In a method of manufacturing a multilayer board, including: a drilling step for forming a via hole through a pre-preg by laser beam machining, a step of filling the via hole with conductive paste containing a resin component and metal powder, and a step of arranging copper layers or copper layer portions of patterned boards on and under the filled conductive paste and pressing the same, a multilayer printed wiring board superior in conductivity and long-term stability is obtained by using alloying paste as the conductive paste in which at least part of the metal powder is melted and the metal powders adjacent to each other are alloyed, using a pre-preg having a ratio A/B of at least 10 before subjected to preheating, where A is a storage modulus at an inflection point where the storage modulus changes from increasing to decreasing and B is a storage modulus at an inflection point where the storage modulus changes from decreasing to increasing in a temperature profile rising from 60° C. to 200° C., and preheating the pre-preg before the drilling step to reduce the ratio A/B to below 10.

6 Claims, 3 Drawing Sheets

(51) Int. Cl.
    *H01B 1/22* (2006.01)
    *H05K 3/40* (2006.01)
    *H05K 1/02* (2006.01)
    *H05K 3/00* (2006.01)
(52) U.S. Cl.
    CPC ............. *H05K 3/4069* (2013.01); *H05K 3/462* (2013.01); *H05K 1/095* (2013.01); *H05K 3/0032* (2013.01); *H05K 2201/0272* (2013.01); *H05K 2201/0355* (2013.01); *H05K 2201/10378* (2013.01); *H05K 2203/0425* (2013.01); *H05K 2203/1461* (2013.01); *Y10T 29/49117* (2015.01); *Y10T 29/49124* (2015.01); *Y10T 29/49139* (2015.01); *Y10T 29/49155* (2015.01); *Y10T 29/49165* (2015.01)

(56) References Cited

U.S. PATENT DOCUMENTS 7,214,419 B2  5/2007  Umeda et al.
7,393,580 B2  7/2008  Kanda

FOREIGN PATENT DOCUMENTS

| JP | 2007-019198 | 1/2007 |
| JP | 4191678 | 9/2008 |
| JP | 2008-243391 | 10/2008 |

(a)

(b)

MULTILAYER WIRING BOARD

REFERENCE TO RELATED APPLICATION

This is a divisional application of Ser. No. 13/256,114, filed Oct. 5, 2011 which is currently allowed. The subject matter of the aforementioned prior application is hereby incorporated herein by reference.

BACKGROUND OF THE INVENTION

The present invention relates to a method of manufacturing a multilayer wiring board and a multilayer wiring board obtained thereby and, more specifically, a method of manufacturing a multilayer wiring board in which via holes are filled with conductive paste containing metal powder.

In recent years, in association with a trend toward reduction of thickness and length of products in the field of electronics, the similar needs are increasing also for a printed wiring board. Multi-layering is inevitable in miniaturization of the printed wiring board and, in order to achieve the multi-layering, reduction of thickness is a technical challenge.

As a method of manufacturing the multilayer wiring board of the related art, there is a method including (a) providing a via hole on a core board 10 having copper layer layers 11 on both surfaces of an insulated material, applying a through hole plating 12 on a wall surface of the via hole and then printing, filling and hardening via-fill paste 13 therein, then (b) polishing projecting portions of the filled conductive paste 13, and then (c) applying cap plating 14 on the both surfaces, as shown in FIG. 4 for example. There is also a method of filling a via hole by using a resin of a resin layer 15 of a core board 10 by disposing copper layers (CCL) 16 having a layer 15 applied with a resin on both sides of the core board 10, with the resin layers 15 facing the core board 10, as shown in FIG. 5(*a*), and pressing the same as shown in (b).

However, the former has a probability of extension of the board after having polished the paste and hence the reduction of the thickness of the film is limited, while the cap plating results in increase in thickness of the copper layers on the surfaces which causes a difficulty of fine patterning. In contrast, the latter has problems of an inability to provide a via hole on a via hole (stacked via), insufficient smoothness of the surface of the board, and generation of cracks at the time of a long-term reliability test.

In cope with these problems, a method of obtaining an internal layer conductivity only with the conductive paste without performing the through hole plating or the cap plating as described above, more specifically, a press method using paste which develops conductivity by contact between conductive powder and conductive powder (hereinafter, referred to as powder contact paste) is employed. However, utilization of such paste causes a problem of generation of roughness because the board immediately above the paste is swelled under normal pressing conditions, and also causes a problem of insufficient long-term reliability because the change rate of conductivity over time is high.

In contrast, the fact that the conductivity and the long-term stability can be improved by using paste containing metal powder which is alloyed by being heated (hereinafter referred to as "alloying paste") and forming alloy between the conductive powders and between the powder and the copper layer is disclosed (Japanese Patent No. 4191678).

In contrast, pre-preg is generally used as a material of the printed board (JP-A-7-176846). The term "pre-preg" means an adhesive sheet obtained by processing thermosetting resin into a state of B-stage, and is normally a glass fiber cloth or the like as a reinforcing material impregnated with a thermosetting resin. When manufacturing the board using the pre-preg described above, a via hole is formed through the pre-preg by laser beam machining as in the related art, conductive paste is filled therein, copper layers or patterned boards are arranged on upper and lower surfaces thereof, and pressing is performed.

However, when forming a through hole with the alloying paste described above, it is necessary to slow down a curing speed of the paste resin component because alloying is hindered if the paste resin component is completely cured before a low melting metal is melted. However, a general pre-preg has problems in that if the curing speed of the paste resin component is slowed down, the conductive paste may spread at the time of pressing, and the resin component of the pre-preg and the paste may be mixed, thereby failing to obtain desired characteristics.

SUMMARY OF INVENTION

In view of such circumstances as described above, it is an object of the present invention to provide a manufacturing method in which a multilayer printed wiring board (hereinafter, referred to as "multilayer board") superior in conductivity and long-term stability even when a general pre-preg, which is advantageous in terms of cost, is used, and a multilayer board obtained thereby.

A method of manufacturing a multilayer board according to the present invention is a method of manufacturing a multilayer board including: a drilling step for forming a via hole through a pre-preg by laser beam machining, a step of filling the via hole with conductive paste containing a resin component and metal powder, and a step of arranging copper layers or copper layer portions of patterned boards on and under the filled conductive paste and pressing the same, characterized by using alloying paste as the conductive paste in which at least part of the metal powder is melted and the metal powders adjacent to each other are alloyed, using a pre-preg having a ratio of A divided by B of at least 10 before subjected to preheating, where A is a storage modulus at an inflection point where the storage modulus changes from increasing to decreasing and B is a storage modulus at an inflection point where the storage modulus changes from decreasing to increasing in a temperature profile rising from 60° C. to 200° C., and preheating the pre-preg before the drilling step to reduce the ratio of A divided by B to below 10.

In the description given above, a pre-preg containing at least one of phenoxy resin, epoxy resin, and bismaleimide-triazine resin (BT resin) is used as the pre-preg.

Also, the preheating is performed normally at a temperature from 80 to 140° C. for 30 to 120 minutes.

Furthermore, it is preferable to use conductive paste having a following composition; (A) with respect to 100 weight parts of resin components containing acrylate resin monomer and epoxy resin pre-polymer, (B) 200 to 2200 parts of metal powder including at least one type of low melting-point metal having a melting point of 180° C. or lower, being sole indium or an alloy of at least two types of metals selected from a group of tin, lead, bismuth, and indium, and a high melting-point metal selected from a group including gold, silver, copper and nickel and/or a high melting-point metal being an alloy having a melting point of 800° C. or higher, obtained from two types of metals selected from the same group, (C) 0.5 to 40 weight parts of curing agent containing 0.3 to 35 weight parts of phenolic curing agent, and (D) 0.3 to 80 weight part of flux.

The multilayer printed wiring board according to the present invention is a multilayer printed wiring board manufactured by forming a via hole through a pre-preg, filling the via hole with conductive paste, and arranging copper layers or copper layer portions of patterned boards on and under the filled conductive paste, using a pre-preg having a ratio of A to B below 10, where A is a storage modulus at an inflection point where the storage modulus changes from increasing to decreasing and B is a storage modulus at an inflection point where the storage modulus changes from decreasing to increasing in a temperature profile rising from 60° C. to 200° C. as the pre-preg, and using conductive paste containing metal powder including two or more types of metals which are alloyed with respect to each other by being heated as the conductive paste. The multilayer printed wiring board can be manufactured by the method of manufacturing according to the present invention described above.

In the specification, "alloying" between metal powders means that two or more types of metals are melted and unified. It means, for example, when a substance including low melting-point metal particles and high melting-point metal particles mixed together is heated, surface layers of the respective particles are melted and unified, thereby forming an alloy layer.

The multilayer board obtained by a method of manufacturing according to the present invention allows fine line patterning because a cap plating is not used, thereby satisfying the demand of reduction in thickness. Also, since the metal powders contained in the conductive paste are alloyed and the metal powder and end surfaces of the conductive layer in through holes are alloyed, so that superior conductivity and long-term stability are achieved. Also, since the problem of spreading or the like does not occur, a general pre-preg can be used, which is advantageous in terms of cost. Also, formation of a stacked via structure is possible. Furthermore, a super-multilayer board can be manufactured with higher yield by joining the multilayer board and the multilayer board. As described above, a high-quality multilayer board in which various problems of the related art are solved can be provided using a general apparatus at low cost.

DETAILED DESCRIPTION OF THE INVENTION

A method of manufacturing a multilayer board according to the present invention includes at least (1) a process of preheating before providing via holes through a pre-preg, (2) a process of providing the via holes through the preheated pre-preg by laser beam machining, (3) a process of filling conductive paste in the via holes, (4) a process of arranging copper layers or copper layer portions of patterned boards on upper and lower surfaces of the filled conductive paste and pressing for unifying the same. In the process (3) described above, alloying paste containing metal powders melted by being heated at the time of curing of the paste wherein melted metal powders are alloyed with respect to each other is used as the conductive paste. In the process (4), if the copper layers which are not patterned are laminated, the patterning is performed after the pressing.

Figure 1:
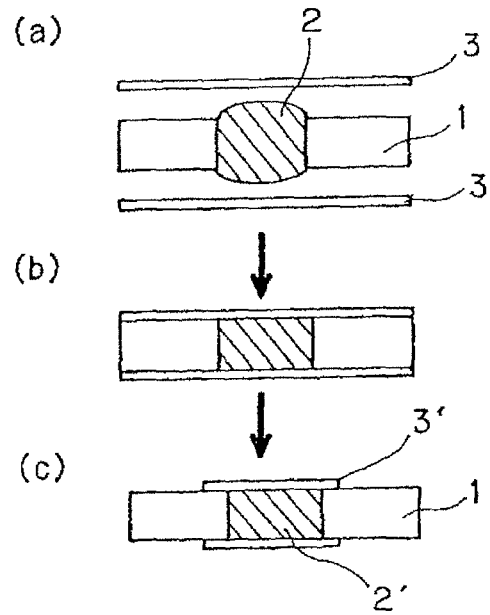
FIG. 1 shows diagrammatic cross-sectional views showing an embodiment of a method of manufacturing a multilayer board according to the present invention.

Referring now to the drawings, description of the present invention will be given further in detail. FIG. 1 shows diagrammatic cross-sectional views showing an embodiment of a method of manufacturing a multilayer board according to the present invention, and showing a case of performing (a) filling a conductive paste 2 in a via hole of a pre-preg 1, (b) arranging copper layers 3 on both upper and lower surfaces of the pre-preg 1 and pressing for unifying the same, and (c) subsequently, performing patterning. Reference numeral 2' denotes a cured conductive paste, and reference numeral 3' denotes patterned copper layers.

Figure 2:
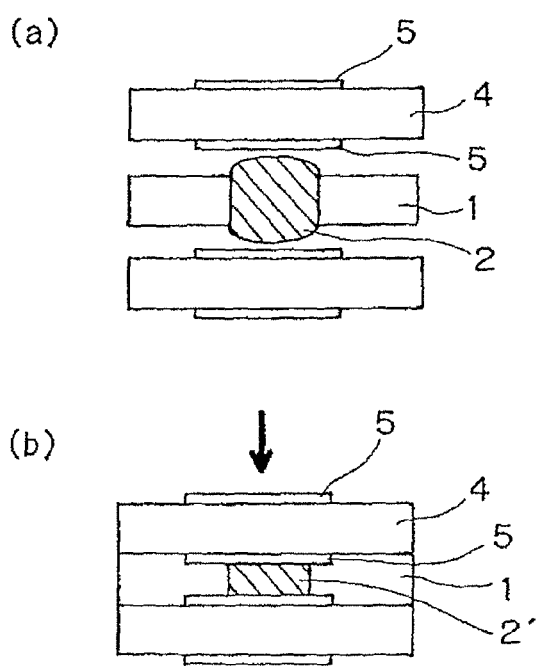
FIG. 2 shows diagrammatic cross-sectional views showing another embodiment of a method of manufacturing a multilayer board according to the present invention.

In contrast, FIG. 2 shows diagrammatic cross-sectional views showing another embodiment of a method of manufacturing a multilayer board according to the present invention, and showing a case of performing (a) filling the conductive paste 2 in a via hole of the pre-preg 1, (b) arranging copper layer portions 5 of a patterned board 4 on both of the upper and lower surfaces of the pre-preg 1 so as to come into contact with the conductive paste and pressing for unifying the same.

Figure 3:
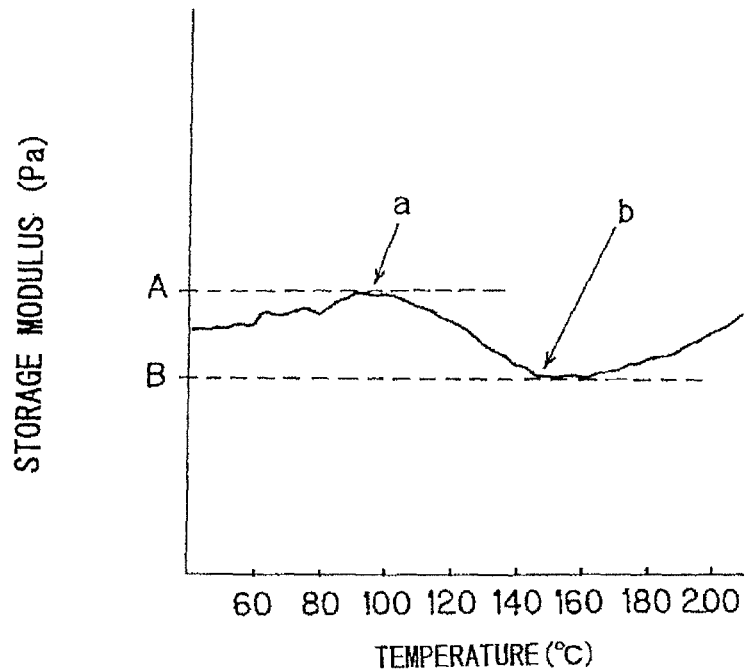
FIG. 3 is a chart showing a result of measurement of storage modulus using a modular compact rheometer (MCR).
Figure 4:
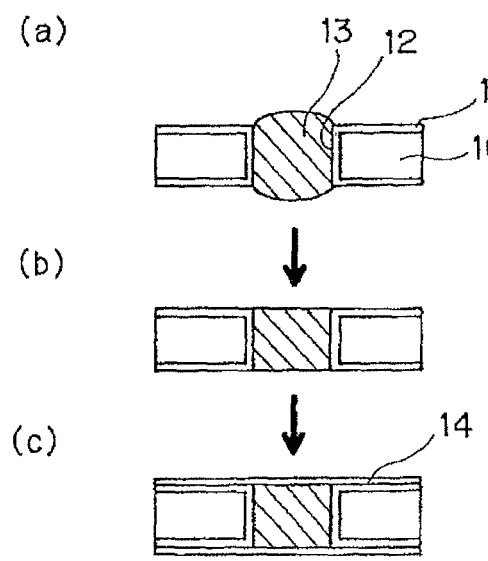
FIG. 4 shows diagrammatic cross-sectional views showing an example of a method of manufacturing a multilayer board of the related art.
Figure 5:
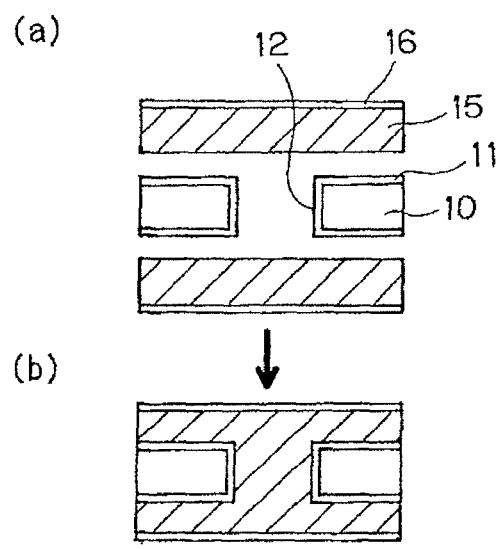
FIG. 5 shows diagrammatic cross-sectional views showing another example of a method of manufacturing a multilayer board of the related art.

The pre-preg used in the present invention is a pre-preg having a ratio A/B of 10 or higher before preheating, where A is a storage modulus at an inflection point e where the storage modulus changes from increasing to decreasing in a temperature profile rising from 60° C. to 200° C. and B is a storage modulus at an inflection point b where the storage modulus changes from decreasing to increasing as shown in FIG. 3. For measuring the storage modulus of the pre-preg, a normal rheometer (for example, Modular Compact Rheometer (MCR) 300 manufactured by Anton Paar) may be used.

The material of the pre-preg is not specifically limited and those containing at least one of phenoxy resin, epoxy resin, bismaleimide-triazine resin (BT resin) used in the related art as a component may be used. Also, glass fiber fabric as a reinforcing material may be those used in the related art.

The preheating may be performed by selecting conditions achieving the ratio A/B of lower than 10, which are different depending on the kinds of the resin and, normally on the order of 30 to 120 minutes at temperatures from 80 to 140° C. As regards the timing of the preheating, the shorter the time from the preheating to the pressing process, the more preferable. The method of performing the preheating is, although not specifically limited, preferably performed by placing the pre-preg between plates having smooth surfaces such as stainless.

Therefore, a period required to achieve the ratio A/B of 10 or lower may be confirmed in advance, and the pre-preg may be heated in an air oven or the like by being placed between the plates having smooth surfaces under the predetermined conditions confirmed in advance before the process of forming via holes in the laser beam machining.

The via holes are provided after the preheating and, at this time, by employing the laser beam machining, a wall surface of the hole is cured to some extent, which also prevent the pre-preg and the paste resin from being mixed.

The conductive paste used in the present invention may need only to be the one containing at least a resin component and metal powder, so that the resin component is cured and at least part of the metal powder is melted by being heated at a predetermined temperature, thereby causing the metal powders, or the metal powder and conductive end surfaces such as the copper layer or the patterned copper portion in contact thereto to alloy.

For example, with respect to (A) 100 weight parts (hereinafter, referred to simply as "parts") of resin components including acrylate resin monomer and epoxy resin pre-polymer, the conductive paste preferably contains (B) 200 to 2200 parts of metal powder including at least two types of metals including a low melting-point metal and a high melting-point metal and (C) 0.5 to 40 parts of curing agent including 0.3 to 35 parts of phenol-based curing agent and (D) 0.3 to 80 parts of flux as essential ingredients.

Detailed examples of the acrylate resin monomer include isoamyl acrylate, neopentyl glycol diacrylate, Trimethylolpropane triacrylate, ditrimethylolpropane tetraacrylate, phenyl glycidyl ether acrylate hexamethylene diisocyanate urethane pre-polymer, acrylic acid adduct of bisphenol A diglycidyl ether, ethylene glycol dimethacrylate, diethylene glycol dimethacrylate.

Detailed examples of the epoxy resin include bisphenol A epoxy resin, brominated epoxy resin, bisphenol F epoxy resin, novolac epoxy resin, alicyclic epoxy resin, glycidylamine epoxy resin, glycidyl ether epoxy resin, glycidylester epoxy resin, heterocyclic epoxy resin.

The compounding ratio (weight %) between the acrylate resin and epoxy resin is preferably 5:95 to 95:5 and, more preferably, 20:80 to 80:20.

The resin component (A) described above may be acrylate resin monomer and epoxy resin pre-polymer blended with at least one of resin components; alkyd resin, melamine resin, and xylene resin. Alkyd resin, melamine resin, and xylene resin are used as resin modifying agent and the invention is not limited thereto as long as the object is achieved. The compound proportion when blending the resin modifying agent as described above is preferably less than 40 weight %, preferably, less than 10 weight % of the total resin component (A).

Although the metal powder may be of any type as long as it causes alloying by being heated, two or more types of metals including at least one type of low melting-point metal having a melting point of 180° C. or lower and one type of high melting-point metal having a melting point of 800° C. or higher are preferably contained. Examples of mode of existence of the two or more types of metals include mixture of a certain type of metal powder with metal powder of other types, a certain type of metal powder coated with another type of metal, and a mixture thereof.

As the low melting-point metal and the high melting-point metal, the metal composed of a single type of metal and an alloy composed of two or more types of metals may be used.

Preferable examples of the low melting-point metal include sole indium (melting point: 156° C.) or an alloy having a melting point of 180° C. or below, of two or more selected from tin (melting point: 231° C.), lead (melting point: 327° C.), bismuth (melting point: 271° C.) and indiums, and two or more types of alloys may also be used.

Preferable examples of the high melting-point metal include gold (melting point: 1064° C.), silver (melting point: 961° C.), copper (melting point: 1083° C.), and nickel (melting point: 1455° C.) or alloys containing at least two types of metals listed here and, two or more types of sole metals or alloys, and combination of sole metal and alloy may also be used.

Although the shape of the metal powder is not limited, and types used in the related art such as dendrite, spherical, and scale type may be used. Although the particle diameter is not limited as well, it is normally on the order of 1 to 50 μm in average diameter.

The compounding amount of the metal powder is preferably 200 to 2200 parts with respect to 100 parts of the resin component (A). Also, the compounding ratio (weight ratio, hereinafter) between low melting-point metal powder and high melting-point metal powder described above is preferably in the range of 8:2 to 2:8.

Subsequently, the curing agent (C) contains phenol-based curing agent as an essential ingredient, and as other agents, imidazole-based curing agent, cationic curing agent, radical curing agent (polymerization initiator) may also be used.

The amount of usage of the phenol-based curing agent is preferably 0.3 to 35 parts with respect to 100 parts of the resin component. The amounts of usage of the curing agents other than the phenol-based curing agent is preferably 0.2 to 35 parts with respect to 100 parts of resin and, preferably 0.5 to 40 parts as the entire curing agent.

Examples of the phenol-based curing agent include novolac phenol and naphthol-based compound. Examples of imidazole-based curing agent include imidazole, 2-undecylimidazole, 2-heptadecylimidazole, 2-etylimidazole, 2-phenylimidazole, 2-ethyl-4-methyl-imidazole, 1-cyanoethyl-2-undecylimidazole, and 2-phenylimidazole. Examples of cationic curing agent include onium compounds as represented by boron trifluoride amine salts, P-methoxybenzene diazonium hexafluoro phosphate, diphenyliodonium hexafluorophosphate, triphenylsulfonium, tetra-n-butyl phosphonium tetraphenylborate, tetra-n-butylphosphonium-o,o-diethyl phosphorodithioate. Examples of radical curing agent (polymerization initiator) include dicumyl peroxide, t-butyl cumyl peroxide, t-butyl hydroperoxide, cumene hydroperoxide.

Furthermore, flux, which is a component (D), has a function to facilitate alloying of the above-described metal powder, and examples include zinc chloride, lactic acid, citric acid, oleic acid, stearic acid, glutamic acid, benzoic acid, oxalic acid, glutamic acid hydrochloride, anilinium chloride, cetyl pyridine bromide, urea, triethanolamine, glycerine, hydrazine, and rosin. The amount of usage of the flux is preferably 0.3 to 80 parts with respect to 100 parts of the resin component.

The conductive paste used in the present invention may be obtained by mixing above described components. However, for example, Metalize Paste (MP series) manufactured by TATSUTA SYSTEM ELECTRONICS Co., LTD. can be preferably used as those offered commercially.

The multilayer board according to the present invention is obtained by heating and, simultaneously, pressing the pre-heated pre-preg after having filled with the conductive paste in the via holes thereof under the conditions corresponding to the used alloying paste. It is easy to join obtained multilayer boards each other by using the preheated pre-preg defined in the present invention to achieve further multi-layering. Since the multilayer board obtained by the present invention is superior in long-term reliability, and is superior in reliability of the joint portion of the multilayers, a super-multilayer board having several tens of layers, which used to be difficult to manufacture in the related art, can be manufactured with improved yield according to the present invention.

Although the present invention will be described further in detail with reference to examples, the present invention is not limited to the examples shown below.

1. Manufacture of Board

A pre-preg (R-1551 manufactured by Panasonic Electric Works CO, Ltd. or GHPL-830 manufactured by Mitsubishi Gas Chemical Company, Inc.) having a thickness of approximately 100 μm shown in Table 1 was used. Preheating was performed in Examples 1 to 3, and Comparative example 3 as described below, and preheating was not performed in Comparative Examples 1 and 2. Holes of φ100 μm and φ150 μm were formed through the pre-preg using $CO_2$ laser, conductive paste shown in Table 1 was filled therein using a printing method, and then pressing was performed using a vacuum pressing machine under the following conditions.

Pressure: 0 kg/cm²→surface pressure 10.2 kg/cm² (pressure rising: 17 minutes, hold: 10 minutes)→surface pressure 30.6 kg/cm² (pressure rising: 24 minutes, hold: 46 minutes)→0 kg/cm² (pressure reduction: 23 minutes).

Temperature: 30° C.→130° C. (temperature rising: 17 minutes, hold: 10 minutes)→180° C. (temperature rising: 24 minutes, hold: 46 minutes)→30° C. (cooling: 23 minutes).

As preheating of the pre-preg, the pre-preg was placed between stainless plates having a thickness of 1.2 mm and was subjected to heating process in a thermostatic bath set to temperatures shown in Table 1 for periods shown in Table 1.

As regards the storage modulus of the pre-preg, a storage modulus A at an inflection point "a" where the storage modulus is changed from increasing to decreasing and a storage modulus B at an inflection point "b" where the storage modulus is changed from decreasing to increasing, in a temperature profile increasing from 60° C. to 200° C., were measured before preheating and after preheating (except for Comparative Examples 1 and 2) respectively using Modular Compact Rheometer (MCR) 300 manufactured by Anton Paar, and the ratio A/B was obtained from these measured values.

As the conductive paste, alloying paste or powder contact paste shown below was used as shown in Table 1.

Alloying type: Metalize Paste (MP series) manufactured by TATSUTA SYSTEM ELECTRONICS Co., LTD.

Powder Contact type: AE1840 manufactured by TATSUTA SYSTEM ELECTRONICS Co., LTD.

2. Evaluation of Board

The following evaluations are performed on the multilayer board obtained by the procedure described above.

(1) Swelling after Pressing

Figure 6:
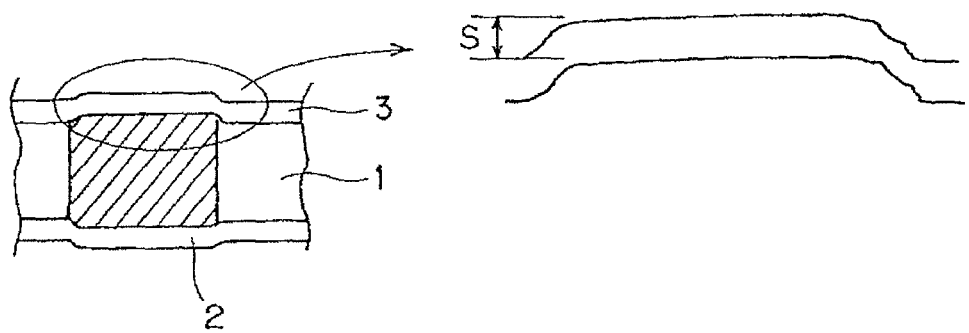
FIG. 6 shows diagrammatic cross-sectional views showing a method of evaluating a swelling amount of the board.

A cross-sectional surface of a finished board was observed by an optical microscope and a swelling amount (s) shown in FIG. 6 was measured, and cases where the swelling amount was smaller than 5 μm were marked by circles, and cases where the swelling amount was 5 m or larger was marked by crosses.

(2) Initial Conductivity

As regards initial conductivity of φ0.15 mm, 200 holes, 400 holes, 600 holes, and 800 holes connecting patterns were manufactured and values of resistance were measured. The values of resistance were divided by respective numbers of holes to obtain the value of resistance per hole, and an average value was calculated. Manufacturing of the 200 holes, 400 holes, and 600 holes connecting patterns were performed with N=6, and manufacturing of the 800 holes connecting pattern was performed with N=2.

As regards the initial conductivity of φ0.10 mm, 200 holes, 400 holes, and 600 holes connecting patterns were made and the values of resistance were measured. The values of resistance were divided by the respective numbers of holes to obtain the value of resistance per hole, and the average value was calculated. Manufacturing of the 200 holes, 400 holes, and 600 holes connecting patterns were performed with N=4.

(3) Rate of Change of Conductivity (Long-Term Reliability)

Rate of change of conductivity was obtained by following expressions:

$$(b-a) \times 100/a$$

where a was a value of resistance measured before a test in a given manufactured connecting pattern, and b is a value of resistance measured after the test, and cases where the rate of change of conductivity was within ±20% were marked by circles, and cases where the rate of change of conductivity was below −20% or over 20% were marked by crosses.

Conditions of the long-term reliability test were as follows.

Solder Dip Test: a cycle wherein immersed in solder at a temperature of 260° C. for 10 seconds and then cooled by atmospheric air at a room temperature was repeated three times.

Pressure Cooker Test (PCT): exposed to atmosphere at a temperature of 121° C., a humidity of 100%, and of 2 atmospheric pressure, for 24 hours.

Heat Cycle Test: a cycle wherein exposed in atmosphere held at −65° C. for 30 minutes and then held at 125° C. for 30 minutes was repeated 1000 times.

Heat Resistance Test: exposed in atmosphere of 100° C. for 1000 hours.

Humidity Resistance Test: exposed in atmosphere of a temperature of 85° C. and a humidity of 85% for 1000 hours.

(4) Insulation Reliability

The conductive paste was filled in holes of φ150 Lm and a comb shaped pattern including three hole pitches of 0.6 mm, 0.8 mm, and 1.0 mm was manufactured. A direct current 50V was applied on the pattern and, after having exposed to a temperature of 85° C., a humidity of 85% for 1000 hours, the value of resistance was measured still in a test atmosphere, and cases where the value of resistance was $10^6 \Omega$ or lager were marked as "good", and cases of being smaller than $10^6 \Omega$ were marked as "poor".

TABLE 1

| | | | | Example 1 | Example 2 | Example 3 | Comparative Example 1 | Comparative Example 2 | Comparative Example 3 |
|---|---|---|---|---|---|---|---|---|---|
| pre-preg | | | | R-1551 | GHPL-830 | R-1551 | R-1551 | GHPL-830 | R-1551 |
| Preheating conditions | | | | 120° C./ 60 min | 120° C./ 60 min | 120° C./ 30 min | nil | nil | 120° C./ 60min |
| storage modulus A/B | | before preheating | | 34.7 | 15.1 | 34.7 | 34.7 | 15.1 | 34.7 |
| | | after preheating | | 4.1 | 2.1 | 9.1 | — | — | 4.1 |
| conductive pasts | | | | alloying type | alloying type | alloying type | alloying type | alloying type | powder contact, type |
| swelling after pressing | | | | good | good | good | good | good | poor |
| rate of change of conductivity | initial conductivity (mΩ/1 hole) | hole diameter | φ 0.15 | 5.1 | 5.3 | 7.4 | 94.8 | 5.7 | 6.6 |
| | | | φ 0.10 | 6.5 | 7.5 | 9.5 | 447 | 10.9 | 390 |
| | rate of change after solder dip test (%) (260° C./10 s × 3 cycles) | hole diameter | φ 0.15 | good | good | good | good | good | good |
| | | | φ 0.10 | good | good | good | poor | good | poor |
| | rate of change after PCT (%) | hole | φ 0.15 | good | good | good | good | good | good |

TABLE 1-continued

|  |  |  | Example 1 | Example 2 | Example 3 | Comparative Example 1 | Comparative Example 2 | Comparative Example 3 |
|---|---|---|---|---|---|---|---|---|
| (121° C./100% RH/2 atm/24 h) | diameter | φ 0.10 | good | good | good | poor | good | poor |
| rate of change after heat cycle | hole | φ 0.15 | good | good | good | good | good | good |
| test (%) (−65° C. 30 m ⇔ 125° C. 30 m/1000 cycles) | diameter | φ 0.10 | good | good | good | good | poor | poor |
| rate of change after heat resistance | hole | φ 0.15 | good | good | good | good | good | good |
| test (%) (100° C./1000 h) | diameter | φ 0.10 | good | good | good | good | good | poor |
| rate of change after humidity | hole | φ 0 15 | good | good | good | good | good | good |
| resistance test (%) (85° C. 85% RH/1000 h) | diameter | φ 0.10 | good | good | good | poor | good | poor |
| insulation reliability | pitch | P = 1.0 | good | good | good | good | good | — |
| (DC50V 85° C. 85% RH/1000 h) |  | P = 0.8 | good | good | good | good | good | — |
| hole diameter: φ 0.15 |  | P = 0.6 | good | good | good | good | good | — |

The invention claimed is:

1. A multilayer printed wiring board manufactured by a method, the multilayer printed wiring board comprising:
a first patterned board,
a second patterned board, and
a pre-preg between the first and second patterned boards, each one of the first and second patterned boards having a copper layer portion, the pre-preg having a hole filled with conductive paste,
wherein the conductive paste comprises:
a resin component, which includes 100 parts by weight of an acrylate resin monomer and an epoxy resin pre-polymer;
a metal powder, which includes a first and a second metal, which together provide 200 to 2200 parts by weight to the conductive paste;
a curing agent, which provides 0.5 to 40 parts by weight to the conductive paste, the curing agent including a phenolic curing agent providing 0.3 to 35 parts by weight to the conductive paste; and
a flux which provides 0.3 to 80 parts by weight to the conductive paste; and
wherein said first metal has a melting point of less than or equal to 180° C., said first metal being indium or a first alloy of at least two types of metal from a group of metals consisting of tin, lead, bismuth, and indium;
wherein said second metal has a melting point of at least 800° C., said second metal consisting of either one or both of:
a metal from the group of metals consisting of gold, silver, copper; and
a second alloy of at least two types of metals from the group of metals consisting of gold, silver, copper; and
wherein the method of manufacturing comprises:
forming the hole through the pre-preg by drilling by laser beam machining,
filling the hole with said conductive paste,
arranging the copper layer portion of the first patterned board at one side of the pre-preg into contact with the conductive paste and pressing the first patterned board relative to the pre-preg,
arranging the copper layer portion of the second patterned board at an other side of the pre-preg into contact with the conductive paste and pressing the second patterned board relative to the pre-preg, and
wherein
in the conductive paste at least a surface layer of the first metal powder is melted whereby the first and second metals are alloyed,
the pre-preg has a ratio of A divided by B of at least 10 before being subjected to preheating, where A is a storage modulus at an inflection point where the storage modulus changes from increasing to decreasing and B is a storage modulus at an inflection point where the storage modulus changes from decreasing to increasing in a temperature profile rising from 60° C. to 200° C., and
preheating the pre-preg before the drilling to reduce the ratio of A divided by B to below 10.

2. The multilayer printed wiring board manufactured by the method of claim 1, wherein the pre-preg comprises at least one of a phenoxy resin, epoxy resin, and a bismaleimide resin.

3. The multilayer printed wiring board manufactured by the method of claim 1, wherein said preheating comprises preheating at a temperature between 80° C. and 140° C. for 30 to 120 minutes.

4. A multilayer printed wiring board manufactured by a method, the multilayer printed wiring board comprising:
patterned boards, and
a pre-preg between a first and a second patterned board of the patterned boards, each one of the first and second patterned boards having a copper layer portion, the pre-preg having a hole filled with conductive paste,
wherein the conductive paste comprises:
a resin component, which includes 100 parts by weight of an acrylate resin monomer and an epoxy resin pre-polymer;
a metal powder, which includes a first and a second metal, which together provide 200 to 2200 parts by weight to the conductive paste;
a curing agent, which provides 0.5 to 40 parts by weight to the conductive paste, the curing agent including a phenolic curing agent providing 0.3 to 35 parts by weight to the conductive paste; and
a flux which provides 0.3 to 80 parts by weight to the conductive paste; and
wherein said first metal has a melting point of less than or equal to 180° C., said first metal being indium or a first alloy of at least two types of metal from a group of metals consisting of tin, lead, bismuth, and indium;
wherein said second metal has a melting point of at least 800° C., said second metal consisting of either one or both of:
a metal from the group of metals consisting of gold, silver, copper; and
a second alloy of at least two types of metals from the group of metals consisting of gold, silver, copper; and
wherein the method of manufacturing comprises:
forming the hole through the pre-preg,
filling the hole with said conductive paste, and arranging said copper layer portions of said patterned boards on and under the filled conductive paste, and wherein the pre-preg has a ratio of A divided by B of below 10, where A is a storage modulus at an inflection point where the storage modulus changes from increasing to decreasing and B is a storage modulus at an inflection point where the storage modulus changes from decreasing to increasing in a temperature profile rising from 60° C. to 200° C., and wherein the metal powder conductive paste comprises alloys of the first and second metals formed by heating of the metal powder mixture.

5. The multilayer printed wiring board manufactured by the method of claim 4, wherein the pre-preg comprises at least one of a phenoxy resin, epoxy resin, and a bismaleimide resin.

6. The multilayer printed wiring board manufactured by the method of claim 4, further comprising preheating the pre-preg at a temperature between 80° C. and 140° C. for 30 to 120 minutes.

\* \* \* \* \*